United States Patent [19]
Varmazis et al.

[11] Patent Number: 5,914,508
[45] Date of Patent: *Jun. 22, 1999

[54] TWO LAYER HERMETIC-LIKE COATING PROCESS FOR ON-WAFER ENCAPSULATION OF GAAS MMIC'S

[75] Inventors: Costas D. Varmazis, Chelmsford; Anthony Kaleta, Lowell, both of Mass.

[73] Assignee: The Whitaker Corporation, Wilmington, Del.

[*] Notice: This patent issued on a continued prosecution application filed under 37 CFR 1.53(d), and is subject to the twenty year patent term provisions of 35 U.S.C. 154(a)(2).

[21] Appl. No.: 08/863,759

[22] Filed: May 27, 1997

Related U.S. Application Data

[63] Continuation of application No. 08/576,524, Dec. 21, 1995, abandoned.

[51] Int. Cl.$^6$ .............................. H01L 21/70; H01L 27/02
[52] U.S. Cl. ........................ 257/275; 428/210; 428/500; 428/698; 428/195; 257/7; 257/272; 257/277; 257/723; 257/787; 257/788; 330/307; 354/205
[58] Field of Search .................................. 428/209, 210, 428/901, 698, 201, 195, 500; 257/723, 787, 788, 275, 277, 7, 265, 272; 357/765; 354/205; 330/307

[56] References Cited

U.S. PATENT DOCUMENTS

| | | |
|---|---|---|
| 4,714,516 | 12/1987 | Eichelberger et al. .................. 156/628 |
| 4,737,236 | 4/1988 | Perko et al. ............................. 156/644 |
| 4,780,177 | 10/1988 | Wojnarowski et al. .................. 156/643 |
| 4,783,695 | 11/1988 | Eichelberger et al. .................... 357/65 |
| 4,835,704 | 5/1989 | Eichelberger et al. .................. 364/490 |
| 4,894,115 | 1/1990 | Eichelberger et al. .................. 156/643 |
| 5,154,793 | 10/1992 | Wojnarowski et al. .................. 156/344 |
| 5,461,545 | 10/1995 | Leroy ........................................ 361/765 |
| 5,497,033 | 3/1996 | Fillion ...................................... 257/723 |

OTHER PUBLICATIONS

Kaleta, et al., GaAs IC Symposium, IEEE Gallium Arsenide Integrated Circuit Symposium 17th Ann. Tech. Dig. 1995. Oct. 29 to Nov. 1, 1995 (abstract only).

Concise Chemical & Technical Dictionary Edited by H. Bennett, pp. 573, 279.

Case et al., High Performance Microwave Elements for SiGe MMICs, Proc. IEEE/Cornell Conference on Advanced Concepts in High Speed Semiconductor Devices and Circuits Aug. 7–9, 1995, pp. 85–92.

M$^4$CMs for Microwave Applications, Feurer et al., ISHM '94 Proceed.

*IEEE Transactions on Components, Hybrids, and Manufacturing Technology*; "Processing and Microwave Characterization of Multilevel Interconnects Using Benzocyclobutene Dielectric"; Chinoy et al.; vol. 16, No. 7, Nov. 1993.

International Conference on Multichip Modules; "Processing and Electrical Characterization of Multilayer Metallization For Microwave Applications"; Percy B. Chinoy; Apr. 1995.

*M/A–COM Loud & Clear*; "Balun" Transformers for RF Chip Sets, Mixers and Broadband Impedance Matching; Simon Gay; Feb. 1995.

IEEE Publication (Publication Title Unknown), "A Photosensitive–BCB on Laminate Technology (MCM–LD)", Publication Date Jan. 5, 1994, pp., 374–386.

*Primary Examiner*—A. A. Turner

[57] ABSTRACT

A microwave system encapsulated by two layers. The first layer is an arylcyclobutene polymer having a thickness greater than the tallest component of the system and only located in predetermined areas. Overlaying the polymer and other preselected areas of the system is a ceramic glass material. These two layers are applied in two layers coating process steps.

12 Claims, 7 Drawing Sheets

TWO LAYER HERMETIC-LIKE COATING PROCESS FOR ON-WAFER ENCAPSULATION OF GAAS MMIC'S

This application is a continuation of application Ser. No. 08/576,524 filed Dec. 21, 1995, now abandoned.

FIELD OF THE INVENTION

The field of the present invention relates to encapsulation of monolithic microwave integrated circuits (MMIC's) particularly MMICs comprising air bridges.

BACKGROUND OF THE INVENTION

Microwave systems are often composed of monolithic microwave integrated circuits (MMICs), other active microwave devices such as GaAs transistors, passive microwave components and other non-microwave components such as logic and control structures.

A monolithic integrated circuit or MMIC is an integrated circuit which is designed to operate at microwave frequencies. MMICs are normally fabricated in GaAs because of the much higher potential operating frequency which GaAs provides as compared to silicon. A typical MMIC may include one or more amplifiers, some passive components and one or more feedback loops which provide feedback from the output of an amplifier or circuit to establish a desired transfer function for that circuit.

The process of designing an interconnection pattern for interconnecting all of the chips and components of an electronic system on a single high density interconnect substrate normally takes somewhere between one week and five weeks. Once that interconnect structure has been defined, assembly of the system on the substrate may begin. First, the chips are mounted on the substrate and the overlay structure is built-up on top of the chips and substrate, one layer at a time. Typically, the entire process can be finished in one day and in the event of a high priority rush, could be completed in four hours. Consequently, this high density interconnect structure not only results in a substantially lighter weight and more compact package for an electronic system, but enables a prototype of the system to be fabricated and tested in a much shorter time than is required with other packaging techniques.

This high density interconnect structure method of fabricating it and tools for fabricating it are represented in U.S. Pat. No. 4,783,695, entitled "Multichip Integrated Circuit Packaging Configuration and Method" by C. W. Eichelberger, et al.; U.S. Pat. No. 4,835,704, entitled "Adaptive, Lithography System to Provide High Density Interconnect", by C. W. Eichelberger, et al.; U.S. Pat. No. 4,714,516, entitled "Method to Produce Via Holes in Polymer Dielectrics for Multiple Electronic Circuit Chip Packaging" by C. W. Eichelberger et al.; U.S. Pat. No. 4,780,177, entitled "Excimer Laser Patterning of a Novel Resist" by R. J. Wojnarowski et al.; U.S. patent application Ser. No. 249,927, filed Sep. 27, 1989, entitled "Method and Apparatus for Removing Components Bonded to a Substrate" by R. J. Wojnarowski et al.; U.S. Pat. No. 4,894,115, entitled "Laser Beam Scanning Method for Forming Via Holes in Polymer Materials" by C. W. Eichelberger, et al.

Many MMICs and other active microwave devices include delicate structures which can easily be damaged or destroyed. These include conductors which are spaced from the surface of the GaAs by an air gap, a structure which is known as an "air bridge". Air bridges are used in these MMICs in order to provide the MMIC with particular desired operational characteristics. These delicate structures severely limit the assembly techniques which can be used to connect these devices into microwave systems. Further, such components are quite sensitive to the placement near their surfaces of conductors or dielectric materials having dielectric constants of more than one, especially in the vicinity of inductors, air bridges and field effect device gate regions.

Hermetic ceramic packages to protect MMICs have been used for some time for long-term protection of MMICs but with considerable tradeoffs in both cost and weight. A low-cost, light-weight alternative can be offered by plastic packages without compromising long-term device reliability. This is possible through the use of polymers for construction of the cavity as well as filler materials to form a barrier to moisture transport in the package cavity. Though these polymers do not affect the electrical performance of low-frequency devices, their relatively high dielectric permittivity and loss tangent can cause substantial changes in the electrical performance of analog MMICs i.e., frequency shift, inductor Q deterioration, mismatches due to impedance changes.

Most microwave control devices i.e., switches and attenuators, are rendered less sensitive to fillers and moisture by avoiding the use of air-bridges and by adding a final coating of SiN 0.5 um thick. Such devices are currently commercially available and have been qualified for commercial RF/microwave systems. Most analog devices, however, not only contain air-bridges, but are also sensitive to the detuning effects of the dielectric of the dielectric coatings.

Many of these devices with air bridges are so sensitive to the presence of overlying dielectric layers that their manufacturers do not even deposit glass passivation layers on the upper surface of those chips because even that thin dielectric layer would adversely affect the operating characteristics of the components. The use of ceramic glass, like SiC, passivating coatings on semiconductor chips is essentially universal in the silicon semiconductor art to prevent environmentally induced deterioration of the devices. Consequentially, in the microwave art disposing any additional dielectric material on an active device or component is looked upon as a sure way to degrade performance and is assiduously avoided.

PRIOR ART SECTION

U.S. Pat. No. 5,073,814 attempts to overcome this disclosed problem by stacking in order and repeatedly in order to a desired height a polyimide polymer (dielectric constant value of 1.93) and a flouropolymer (dielectric constant value of 2.7 to 3.5) upon a MMIC. The two polymers are then laser ablated upon the MMIC, so the multi-stacked polymer layers can be laser drilled as was previously done in all polyimide layers for interconnecting overlying MMICs. U.S. Pat. No. 5,073,814 is specifically designed, however, for overlaying every component on the MMIC, which results in poor electrical performance of particular chip components.

OBJECTS OF THE INVENTION

It is an object of the present invention to provide a process to encapsulate a MMIC.

It is another object of the present invention to provide an encapsulated MMIC comprising a MMIC overlayed by a low dielectric polymer in predetermined areas and a ceramic layer overlaying the low dielectric polymer and other preselected areas.

An object of the present invention is to encapsulate a MMIC and not adversely affect the electrical performance of low-frequency devices.

Another object of the present invention is to have a practical means of accurately modeling arbitrarily shaped coatings of undefined thickness.

SUMMARY OF INVENTION

The objects of this invention have been accomplished by providing a MMIC encapsulated by overlaying a low dielectric polymer in predetermined areas and overlaying in preselected areas a ceramic glass material.

Embodiments of the invention will now be described with reference to the accompanying drawings, according to which.

DETAILED DESCRIPTION OF THE INVENTION

Figure 1:
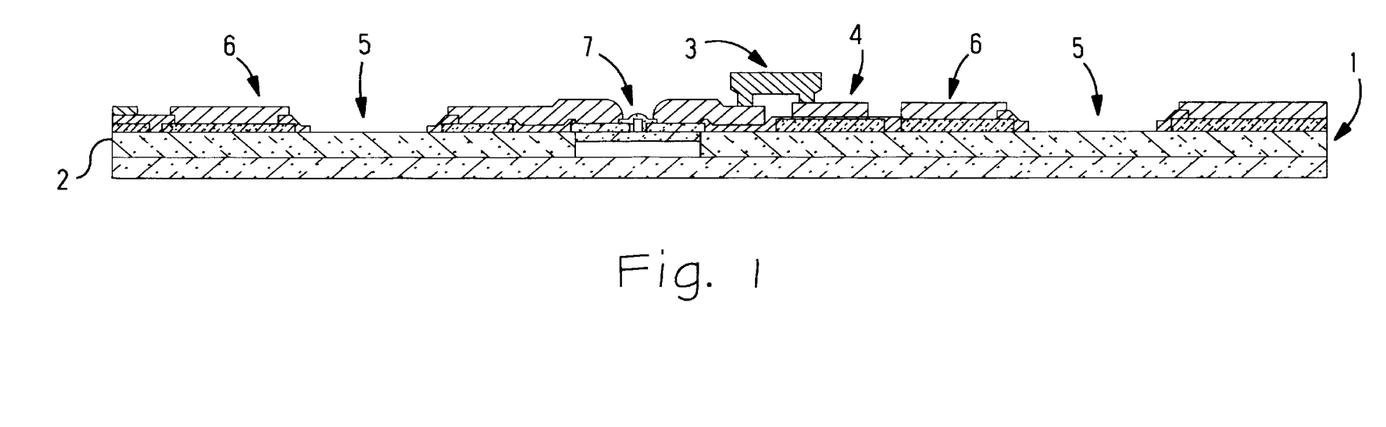
FIG. 1 is a side view of a MMIC.
Figure 2:
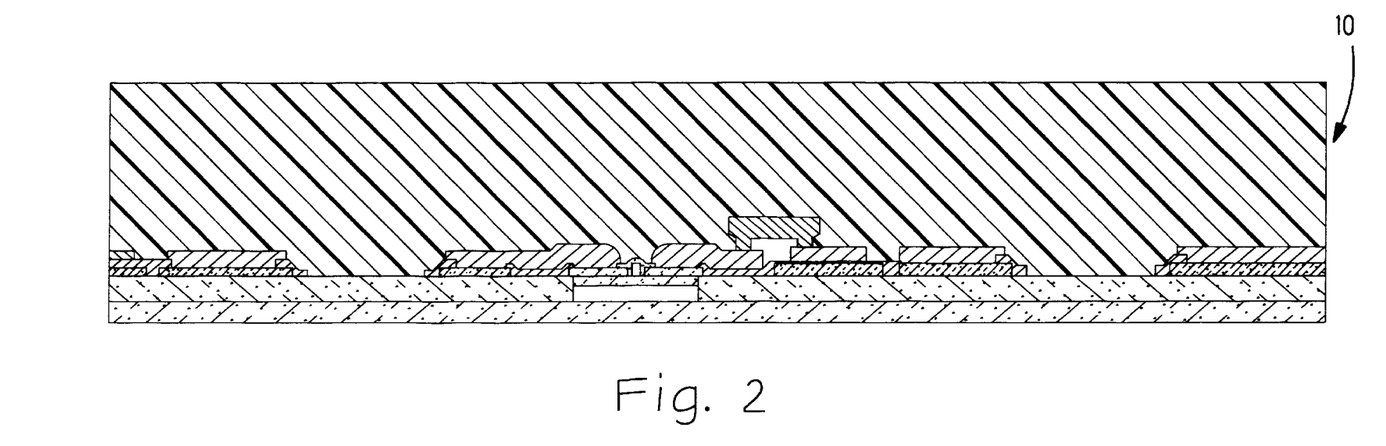
FIG. 2 is a side view of a low dielectric polymer overlaying FIG. 1.

Referring to FIGS. 1 and 2 a coating process comprises applying a sufficient coating of a low dielectric polymer 10 upon a processed MMIC board 2 comprising of conventional board material, such as glass, gallium arsenide or quartz. Preferably the board 3 is gallium arsenide or semi-insulating gallium arsenide. The processed board MMIC board has various components, such as airbridges 3, capacitators 4, streets 5, bond pads 6, and field effect transistors 7 (FET) overlying and attached to the board 2.

Figure 3:
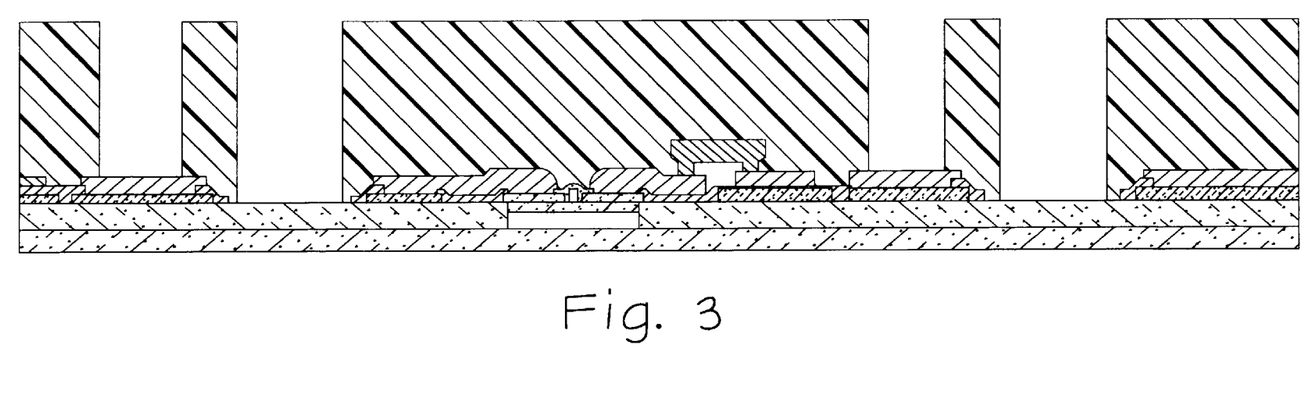
FIG. 3 is a side view of said low dielectric polymer of FIG. 2 being removed in part.

The polymer 10 is removed from all bond pads 6 and streets 5 of the MMIC board 10, as illustrated in FIG. 3, by first photoexposing the polymer through a negative mask (not shown), and then rinsing the polymer with a conventional polymeric solvent, such as the Stoddard solvent (not shown). Thereby, the polymer remains in predetermined areas. The low dielectric polymer is then cured at a low temperature upon the processed MMIC board.

Figure 4:
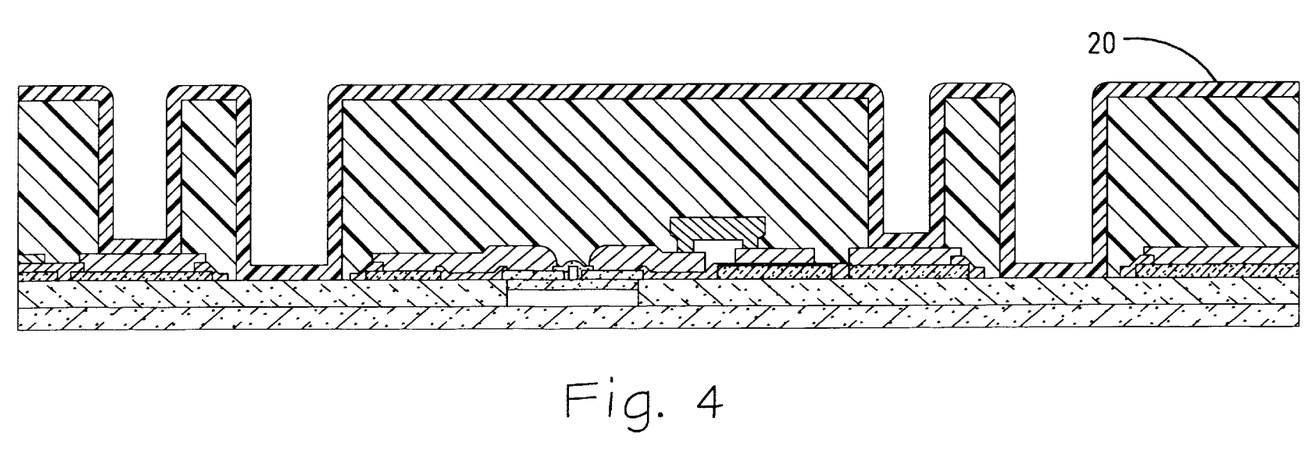
FIG. 4 is a side view of a ceramic glass coating layer overlaying the structures indicated in FIG. 3.
Figure 5:
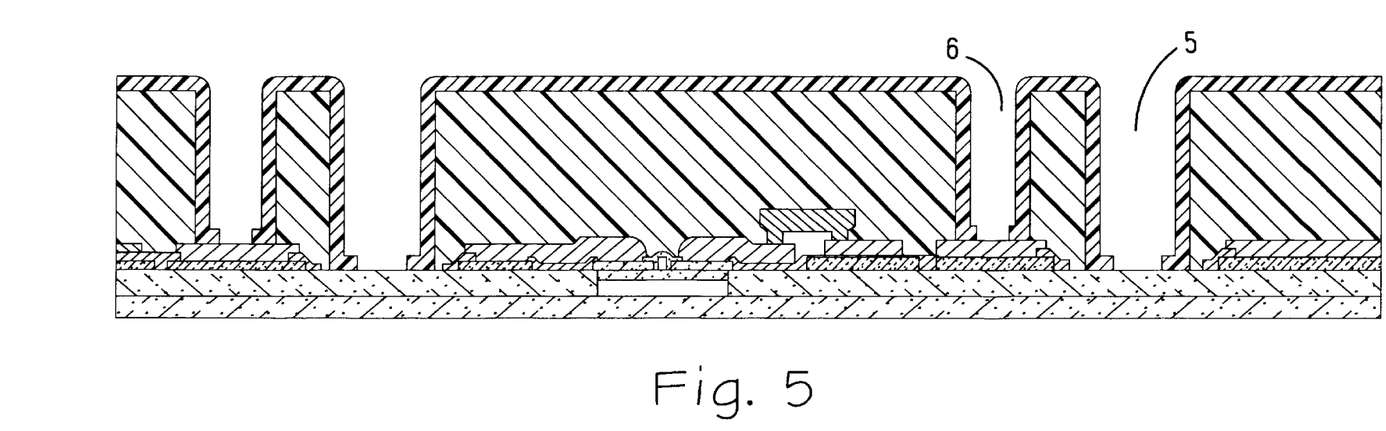
FIG. 5 is a side view of said ceramic glass coating layer of FIG. 4 being removed in part.
Figure 6:
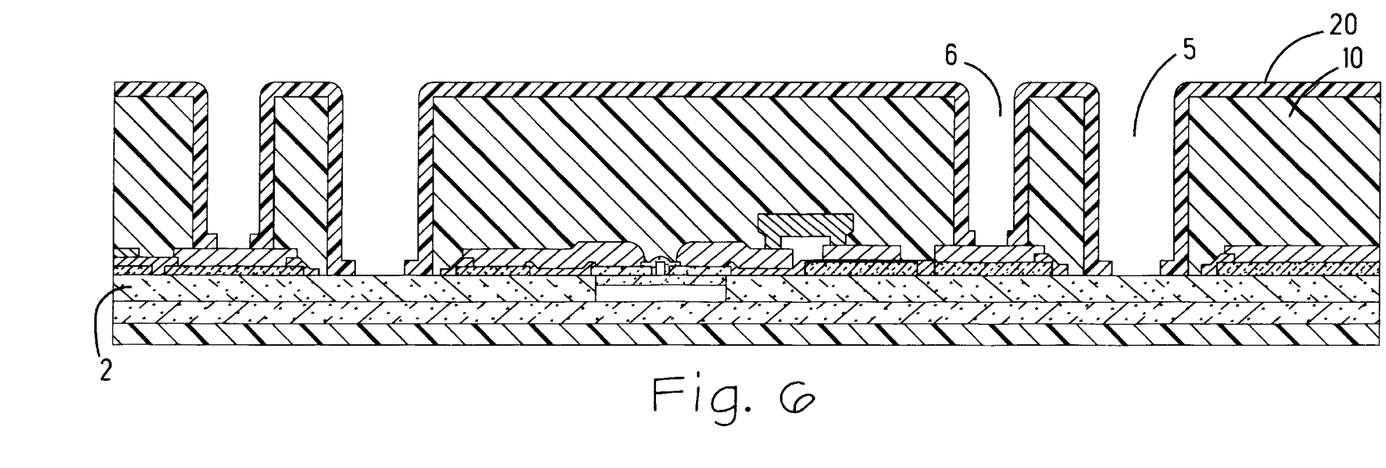
FIG. 6 is a side view of the present invention.
Figure 7:
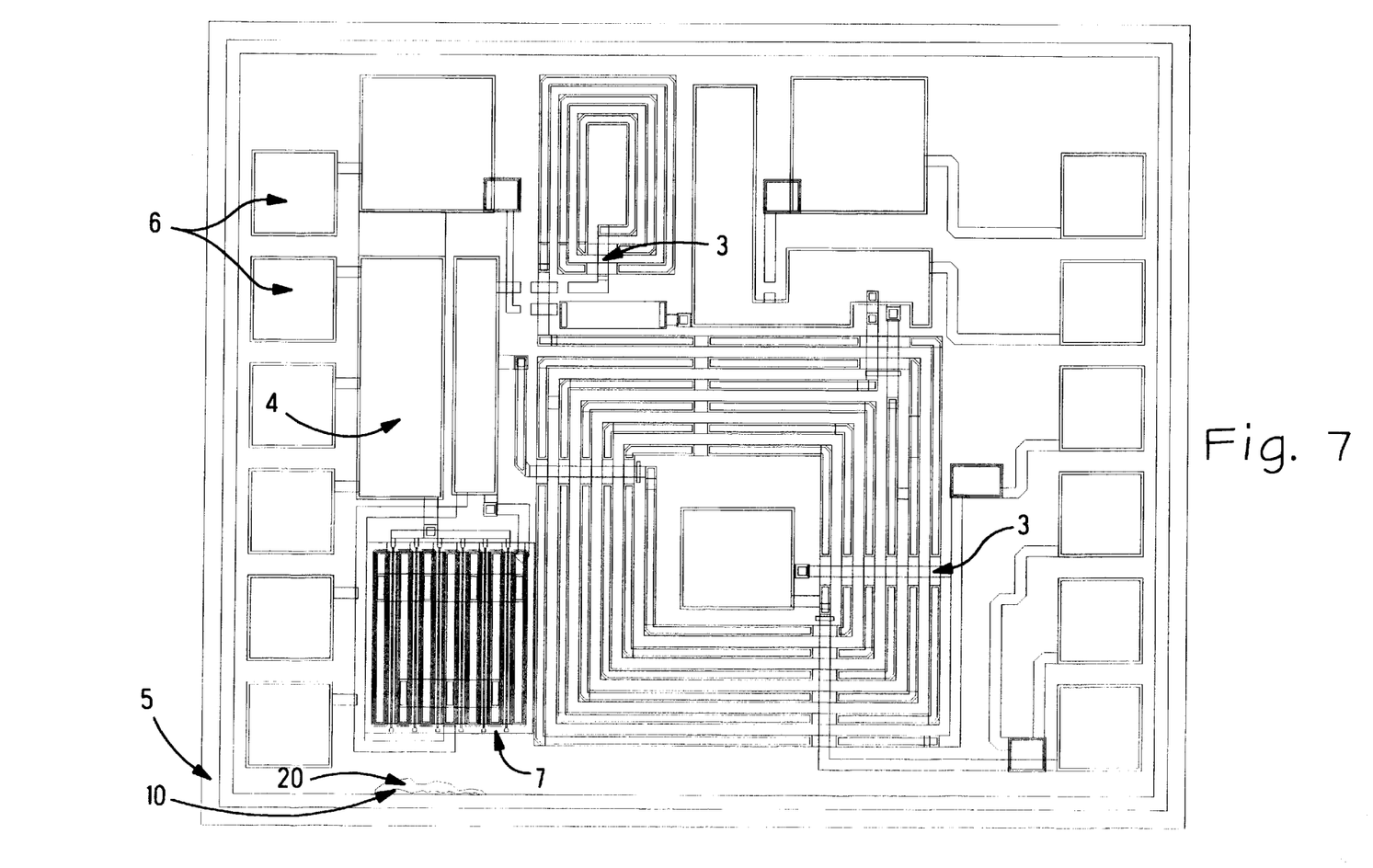
FIG. 7 is a top view of the present invention.

In reference to FIG. 4, a ceramic glass coating 20 overlays the processed MMIC board and low dielectric polymer. The ceramic glass coating is removed from the bond pads and streets by applying a positive photoresist material upon the preselected areas of the polymeric coated MMIC. The ceramic glass coating is exposed and then the resist material, like A2 5200, and the photoexposed areas of the ceramic glass material are etched using conventional reative ion etching techniques, as illustrated in FIG. 5. As FIG. 6 illustrates, the polymeric and ceramic glass coated processed MMIC is finished by backside processing procedures. FIG. 7 merely illustrates the top side of the finished MMIC wafer having a polymeric coating overlayed by a ceramic glass coating.

The low dielectric polymer possesses mechanical, electrical and chemical properties that make it compatible with MMIC fabrication processes. In particular, the low dielectric polymer is preferably spin-coatable and photo-imageable so the polymer can be patterned using simple photolithography. Moreover, the polymer would preferably have a low loss tangent, like 0.002 at 10 Ghz result in minimum perturbation in the microwave performance of the overlayed MMIC. Such low dielectric polymers, such as an arylcyclobutene like benzocyclobutene or those incorporated by reference in U.S. Pat. No. 5,171,824, having dielectric permittivity ranging below 3.0, preferably below 2.0.

The low dielectric polymer provides sufficient resistance to moisture. This sufficiency resistance to moisture is increased by overlaying a ceramic-glass layer, like SiC, upon the low dielectric polymer and other pre-determined areas.

In particular, the process of encapsulating the MMIC entails spinning upon the MMIC a uniform coat of the photosensitive, low dielectric polymer and then photo pattern the polymer so that predetermined areas are coated, and other areas like bond pads and wafer streets upon the MMIC are open. The uniform coating is sufficiently thick to cover the tallest structure on the MMIC, such as air bridges, which usually require about 10–20 microns of the polymer. The polymer is then cured at 250° C. in a vacuum oven under a nitrogen atmosphere for about an hour. After curing the polymer, the ceramic glass layer is deposited upon the polymer and the remaining portions of the MMIC by Plasma Enhanced Chemical Vapor Deposition (PECVD) at 250° C. as referenced in M. Loboda, "Low Temperature PECVD Growth and Characterization of SiC: H Films Deposited from Silacyclobutane and Silanel Methane Precursor Gases" in Amorphous and Crystalline Silicon Carbide IV, C4 Yang, M. M. Rahman and G. L. Harris, eds; Springer Proc. in Physics (Springer Verlag, Berlin Heidelberg), 71, p. 271–280, 1992. The ceramic glass layer is then patterned using Reactive Ion Etching Techniques (RIE) and conventional photo-resist techniques as an etch mask. Again, the ceramic layer like the polymer leaves portions of the MMIC like bond pads and wafer streets open.

EXAMPLE 1

A comparison study of the effects of a low dielectric polymer on a MMIC's field effect transistor (FET) was conducted. Before the low dielectric polymer was applied, the FET was tested for various electrical parameters set forth in Table 1. After the low dielectric polymer, particularly benzocyclobutene was applied and cured at 10 microns thick, the FET was again tested for the same various electrical parameters set forth in Table 1. A control FET, which had no low dielectric polymer applied, was also analyzed for the various electrical parameters in order to quantify the amount of measurement error. Only the percent differences of the control wafer are set forth at Table 1 in the parenthesis.

TABLE 1

FET Model Parameters Before and After 10 μm BCB Layer
0.5 × 300 μm; Control FET in ()
Vds = 3 Volts; 25% Idss

| FET Model Parameters | Before BCB | Difference after BCB | Percent difference |
|---|---|---|---|
| Ftau (GHz) | 26.6 | −1.10 | −4.2 (−0.7) |
| Gm (mS/mm) | 186 | −2.47 | −1.4 (−0.4) |
| Gm_DC (mS/mm) | 161 | 3.37 | −2.1 (0.1) |
| Tau (pSec) | 4.11 | −0.26 | −6.1 (−3.4) |
| Rd (Ohms*mm) | 1.155 | 0.000 | 0.0 (0.0) |
| Rs (Ohms*mm) | 0.788 | −0.003 | −0.3 (−1.2) |
| Cgs (pF/mm) | 1.129 | 0.036 | 3.2 (0.0) |
| Cgd (pF/mm) | 0.139 | 0.034 | 25.0 (−0.9) |
| Cds (pF/mm) | 0.189 | 0.051 | 26.7 (1.2) |
| Idss (mA/mm) | 209 | −2.2 | −1.0 (0.0) |
| Vp (Volts) | −1.22 | 0.0 | 0.0 (−0.6) |

The most substantial changes occurred in the FET intermode capacitances Cgs (gate-source), Ggd (gate-drain) and Cds (drain-source), with the remaining FET electrical parameters essentially remaining unchanged. Both Cgs and Cgd showed the same incremental change of approximately 0.035 pF/mm, while Cds was slightly higher at 0.05/pFmm. The control FET showed essentially no difference.

EXAMPLE 2

In a similar comparison study of MMIC spiral inductors, electrical parameters of the spiral inductors were also measured before and after they were coated with 10 m thick benzocyclobutene. The electrical parameters of this comparison study were disclosed in Table 2, again there was a control.

TABLE 2

Inductor Model Parameters Before and After 10 μm BCB layer
LB23 11 Segments; 2.5 Turns
W = 15 μm; Space = 6 μm; 300 μm Square
4 mil Substrates; Control wafer in ()

| Inductor Model Parameters | Before BCB | Difference after BCB | Percent difference |
|---|---|---|---|
| L (nH) | 2.767 | −0.071 | −2.6 (−2.2) |
| Q | 41.2 | 5.0 | 12.1 (14.6) |
| C1 (pF) | 0.078 | 0.002 | 3.0 (1.8) |
| C2 (pF) | 0.065 | 0.002 | 3.8 (3.5) |
| Cp (pF) | 0.006 | 0.007 | 112.0 (10.2) |

The only significant difference was an increase in the capacitance Cp of 112%.

EXAMPLE 3

Figure 8:
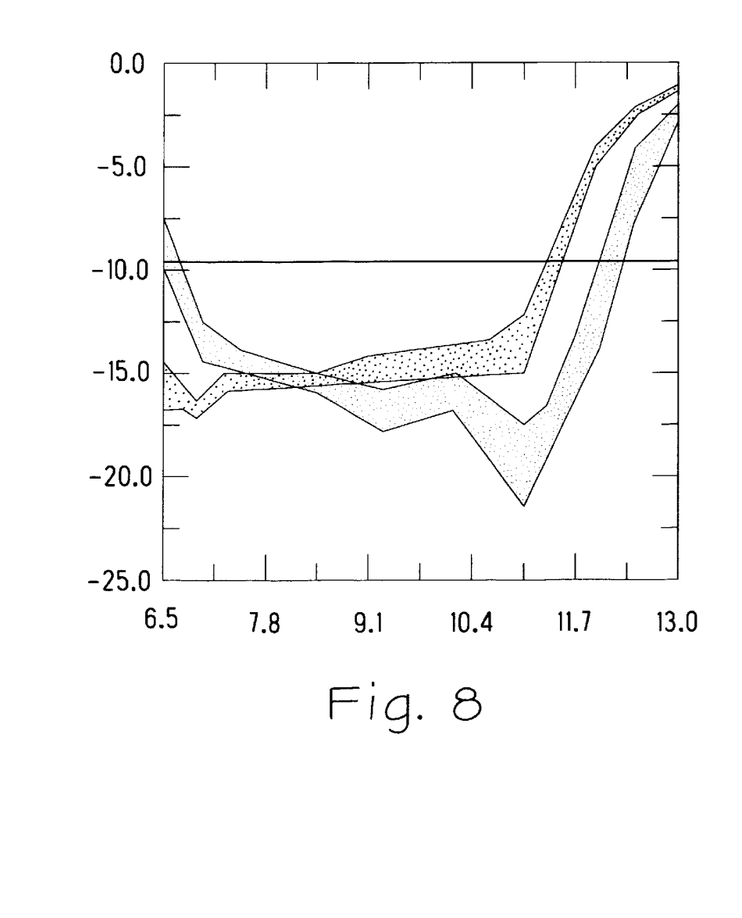
FIG. 8 is a graph of the measured results of a x-band LNA both before and after 10 μm of low dielectric polymer is applied to a MMIC.
Figure 9:
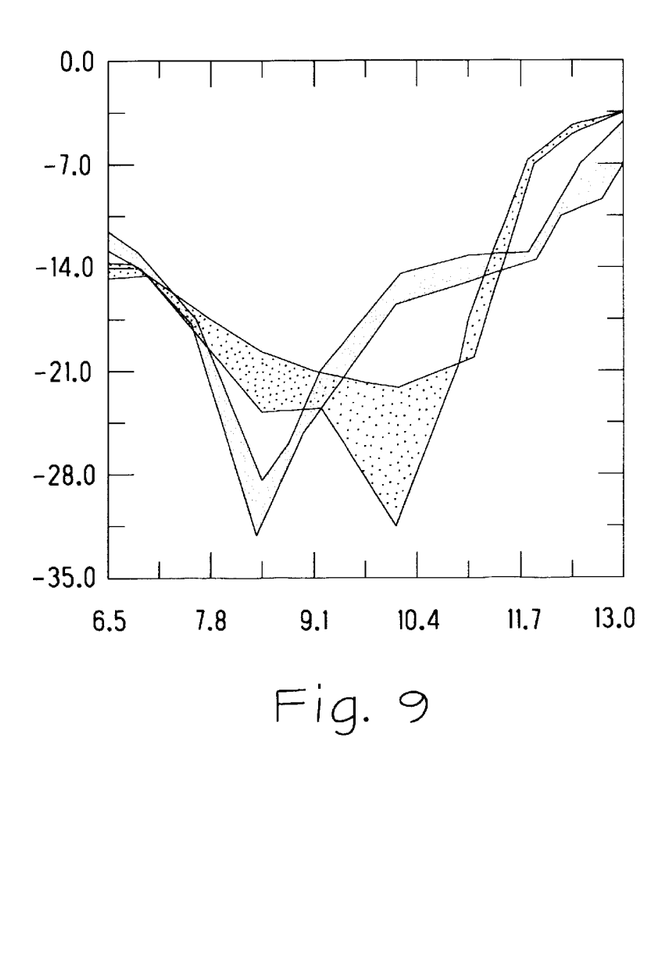
FIG. 9 wherein the curves are shifted about 1 GHz lower in frequency with a slight drop in gain of 0.75 dB.
Figure 10:
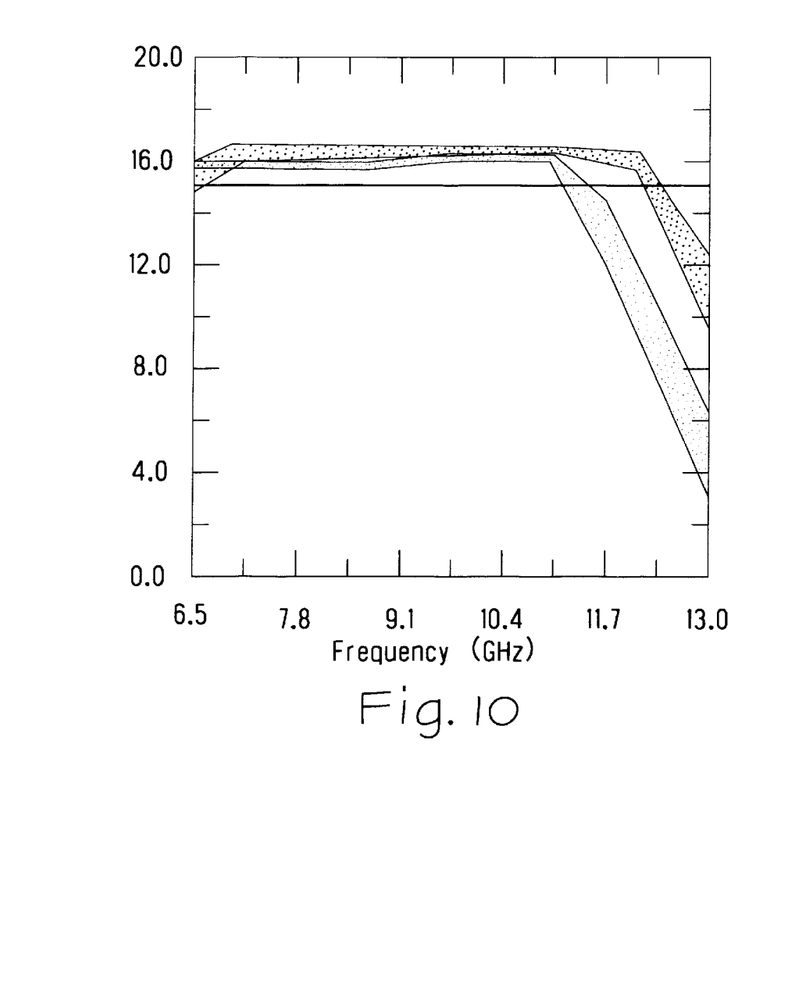
FIG. 10 wherein the curves are shifted about 1 GHz lower in frequency with a slight drop in gain of 0.75 dB.
Figure 11:
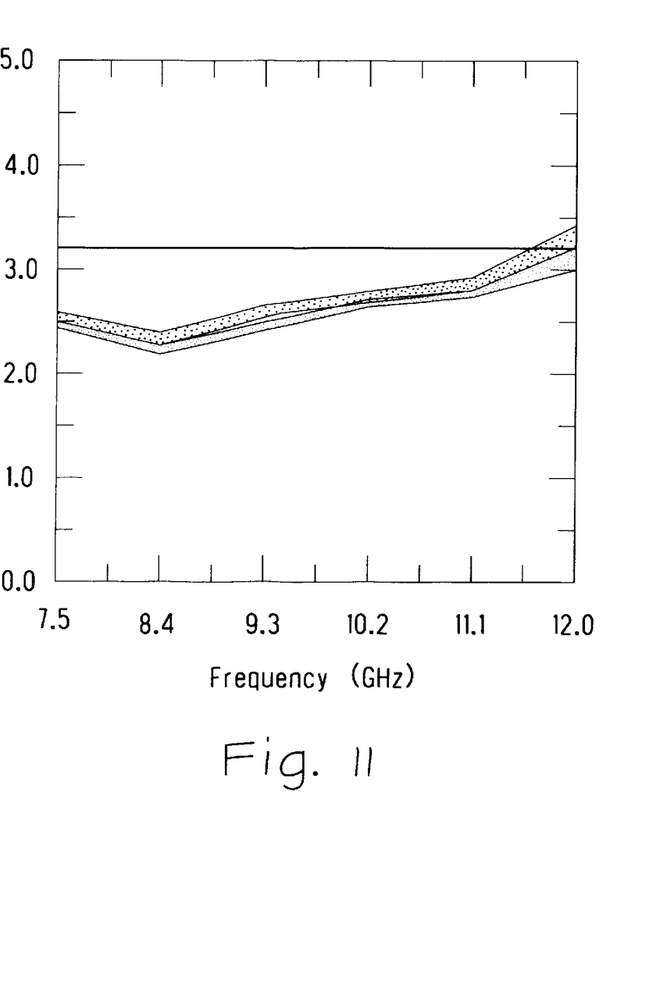
FIG. 11 wherein the curves are shifted about 1 GHz lower in frequency with a slight drop in gain of 0.75 dB.
Figure 12:
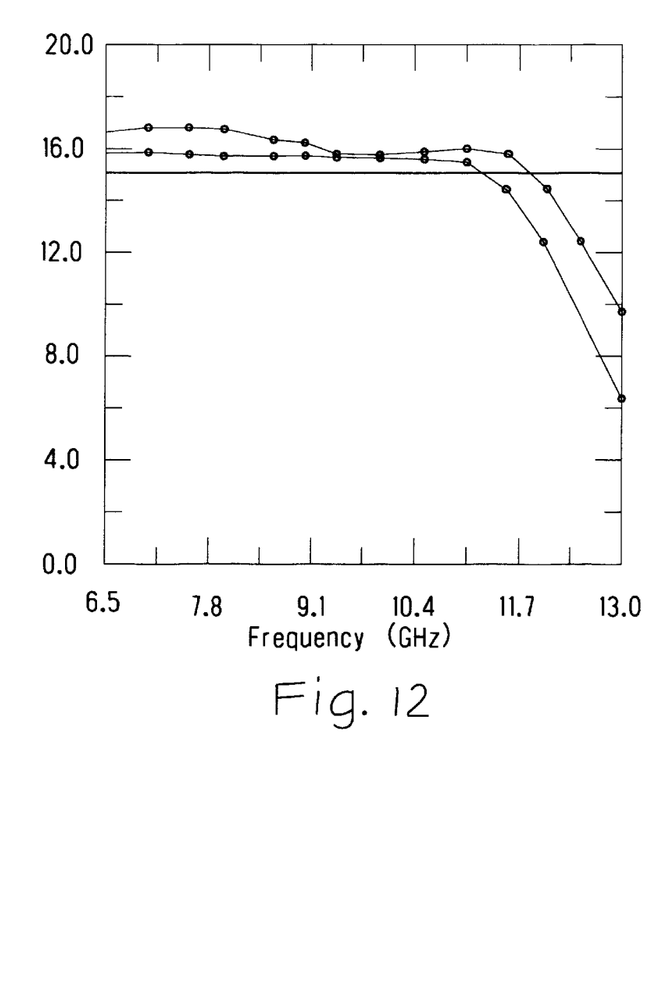
FIG. 12 is a graph of simulated results of the x-band LNA of FIG. 10 both before and after 10.0 μm of low dielectric polymer coating is applied wherein the graph also shows about a 1 GHz shift in frequency toward the lower end of the band.
Figure 13:
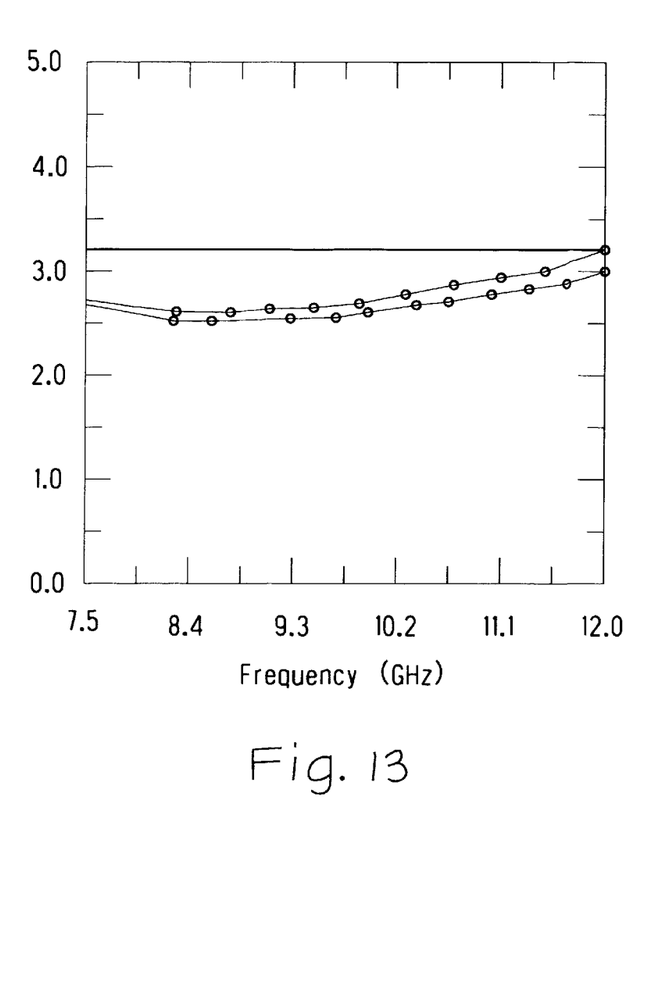
FIG. 13 is a graph of simulated results of the x-band LNA of FIG. 11 both before and after 10.0 μm of low dielectric polymer coating is applied wherein the graph also slows about a 1 GHz shift in frequency toward the lower end of the band.

The electrical performance of a two stage x-band low noise amplifier (LNA) was also evaluated before and after it was coated with 10 μm thick benzocyclobutene. As the results in FIGS. 8, 9 and 10 indicate, input and output matching along with the gain shifted down in frequency by approximately 1 GHz. In addition the gain dropped a mere 0.75 dB near the lower end of the band but still remained above the minimum specification of 15 dB. The noise figure increased slightly by 0.15 dB with a larger increase of 0.27 dB near the very top of the band but still managed to remain below the specification of 3.2 dB as illustrated in FIG. 11. This increase is due primarily from the shift in gain towards the lower end of the band due to the detuning effects of the benzocyclobutene film. Once, however, the shift due to the benzocyclobutene film has been quantified on FETs and indicators, the LNA's performance can be re-process centered. Modeled data shown in FIGS. 12 and 13 fit exceedingly well with the measured data shown respectively in FIGS. 10 and 11.

To ensure the reliability of the coated MMICs under adverse environmental conditions, and extensive reliability investigation of the coated samples was conducted. These reliability experiments did not show any failures after 150 hours in an autoclave (120° C. and 100% humidity).

Many changes, modifications, variations and other uses and applications of the subject invention will, however, become apparent to those skilled in the art after considering the specification and the accompanying drawings which disclose preferred embodiments thereof. All such changes, modifications, variations and other uses which do not depart from the spirit of the invention are deemed to be covered by the invention which is limited only by the claims that follow.

What is claimed is:

1. A microwave apparatus comprising a microwave system and a low dielectric arylcyclobutene polymer overlaying areas of said system, and a SiC overlaying said polymer and preselected areas of said system.

2. A microwave apparatus according to claim 1 wherein said arylcyclobutene is benzocyclobutene.

3. A microwave apparatus according to claim 1 wherein said system further comprising a monolithic microwave integrated circuit (MMIC) comprising components.

4. A microwave apparatus according to claim 3 wherein said MMIC comprises gallium arsenide.

5. A microwave apparatus according to claim 3 wherein said components comprise a field effect transistor.

6. A microwave apparatus according to claim 3 wherein said components comprise an amplifier.

7. A microwave apparatus according to claim 3 wherein said components comprise a switch.

8. A microwave apparatus according to claim 6 wherein said amplifier is low noise amplifier.

9. A microwave apparatus according to claim 6 wherein said amplifier is a power amplifier.

10. A microwave apparatus according to claim 3 wherein said component comprises an air bridge.

11. A microwave apparatus according to claim 3 wherein said structures of said MMIC comprise bonding pads, streets, capacitors, FETs and spiral inductors.

12. A microwave apparatus according to claim 11 wherein said polymer and said SiC do not overlay said street and said bonding pads.

* * * * *

UNITED STATES PATENT AND TRADEMARK OFFICE
CERTIFICATE OF CORRECTION

PATENT NO. : 5,914,508
DATED : June 22, 1999
INVENTOR(S) : Costas D. Varmazis

It is certified that error appears in the above-indentified patent and that said Letters Patent is hereby corrected as shown below:

On the title page item [56], insert--

OTHER DOCUMENTS ( Including Author, Title, Date, Pertinent Pages, Etc.)

C. Y. Yang, M. M. Rahman, G. L Harris (Eds.), Amorphous and Crystalline Silicon Carbide IV, Proceedings of the 4th International Conference, Santa Clara, CA October 9-11, 1991, Springer-Verlag, Berlin Heidelberg New York, London Paris Tokyo, Hong Kong Barcelona, Budapest, ppgs- 270-280

--.

Signed and Sealed this

Ninth Day of November, 1999

Attest:

Attesting Officer

Q. TODD DICKINSON

Acting Commissioner of Patents and Trademarks